(12) United States Patent
Davis (10) Patent No.: US 6,529,059 B1
(45) Date of Patent: Mar. 4, 2003

(54) OUTPUT STAGE ESD PROTECTION FOR AN INTEGRATED CIRCUIT

(75) Inventor: Paul Cooper Davis, Muhlenberg Township, Berks County, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/626,221

(22) Filed: Jul. 26, 2000

(51) Int. Cl.[7] .............................. H03K 5/08; H03L 5/00
(52) U.S. Cl. ..................... 327/310; 361/90; 361/91.1; 327/327; 327/314
(58) Field of Search ................................ 327/310, 313, 327/314, 325, 327, 328; 361/90, 91.1, 111

(56) References Cited

U.S. PATENT DOCUMENTS

| | | | |
|---|---|---|---|
| 4,763,184 A | 8/1988 | Krieger et al. ............ 357/23.13 |
| 4,990,802 A | 2/1991 | Smooha ...................... 307/482 |
| 5,065,113 A | * 11/1991 | Boezen et al. .............. 330/260 |
| 5,264,723 A | 11/1993 | Strauss ....................... 257/532 |
| 5,304,839 A | 4/1994 | Chen et al. .................. 257/546 |
| 5,345,357 A | 9/1994 | Painka ......................... 361/56 |
| 5,391,948 A | * 2/1995 | Izumita ....................... 327/310 |
| 5,446,302 A | 8/1995 | Beigel et al. ................ 257/355 |
| 5,463,520 A | 10/1995 | Nelson ........................ 361/56 |
| 5,465,070 A | * 11/1995 | Koyama et al. ............ 327/350 |
| 6,154,063 A | * 11/2000 | Fang et al. .................. 326/126 |
| 2002/0008563 A1 | * 1/2002 | Lin .............................. 327/310 |

OTHER PUBLICATIONS

"Input–protection scheme tops other approaches", Mediatronix Private Limited, Kerala, India, Kannan Natarajan, EDN Jan. 6, 2000. P. 124.
"Input–Protection Scheme Tops Other Approaches," K. Natarajan, Mediatronix Private Limited, Kerala, India, *Design Ideas, EDN*, Jan. 6, 2000.
"ESD In Silicon Integrated Circuits," Ajith Amerasekera et al., *Design And Measurement in Electronic Engineering*, 1995.

* cited by examiner

*Primary Examiner*—Terry D. Cunningham
*Assistant Examiner*—Quan Tra
(74) *Attorney, Agent, or Firm*—Ryan, Mason & Lewis, LLP (57) ABSTRACT

An integrated circuit including a transistor having a first electrode coupled to an output bond pad and a second electrode coupled to a reference potential, such as ground bond pad. A degeneration device is coupled between the second electrode and the reference potential. A diode is coupled between the second electrode of the transistor and the reference potential with the anode of the diode coupled to the second electrode reference potential and the cathode of the diode coupled to the reference potential for an NPN transistor.

21 Claims, 4 Drawing Sheets

OUTPUT STAGE ESD PROTECTION FOR AN INTEGRATED CIRCUIT

TECHNICAL FIELD

The present invention relates generally to integrated circuits, and in particular to electrostatic discharge protection (ESD) of circuitry coupled to an output stage of an integrated circuit.

BACKGROUND OF THE INVENTION

The protection of integrated circuits (ICS) from damage due to ESD has received increased design attention, particularly as circuit geometries migrate to smaller dimensions. ESD damage can occur as a result of a voltage ESD event or a current ESD event. The book "ESD in Silicon Integrated Circuits" by A. Amerasekera and C. Duvvury, copyrighted in 1995 by John Wiley & Sons, which is hereby incorporated by reference, discloses much about the topic of electrostatic discharge phenomena. The damage may occur during manufacture of the IC chip, or more commonly, after the chip is packaged such as during handling, shipping or use.

One ESD protection technique to protect the input of a packaged IC employs resistors to reduce ESD voltages transmitted to the IC through bond pads. ESD events are transmitted to chip bond pads of packaged chips by package leads. Another technique employs a transistor to clamp the operating voltage on an input bond pad to a safe level. Yet another technique employs a four-layer device, such as a thyristor, to introduce hysteresis into the protective circuitry. Yet another technique protects the input of an integrated circuit from an ESD event has been to provide two steering diodes, each having an area large enough to conduct the expected current Another prior art technique, shown in FIG. 8, has a first steering diode 30*h* between the output bond pad 14*h* and the positive supply bond pad 28*h*. The first steering diode has a cathode coupled to the positive supply bond pad and an anode coupled to the output bond pad. The first steering diode is reverse-biased and non-conducting under normal operating conditions. The first steering diode provides a low impedance path from the output bond pad to the positive supply bond pad 28*h* when the output bond pad voltage is more than one diode voltage drop above the voltage at the positive supply bond pad. The second steering diode 32*h* is coupled between the ground bond pad 18*h* and the output bond pad 14*h*. The second steering diode has a cathode coupled to the output bond pad and an anode coupled to the ground bond pad. The second steering diode under normal operating conditions is reverse-biased and non-conducting. The second steering diode provides a low impedance path from the output bond pad to the ground bond pad in the event the output bond pad voltage is more than one diode voltage drop below the voltage at the ground bond pad. The first and second steering diodes are sized to accommodate the largest current expected due to an ESD event.

Figure 8:
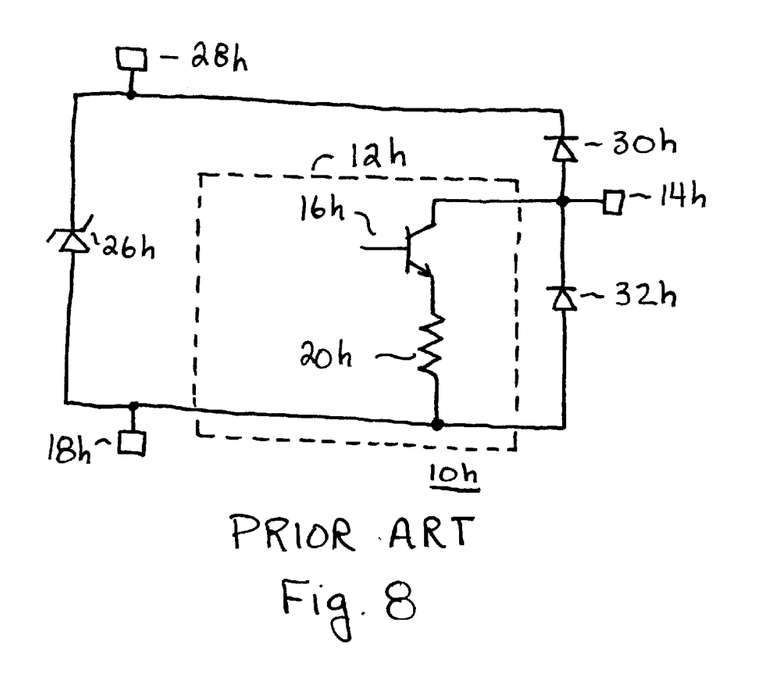
FIG. 8 is a schematic diagram of an output stage portion of an integrated circuit illustrating a prior art electrostatic discharge protection circuit.

In radio frequency circuits, the output bond pad is typically inductively coupled to the positive supply. The DC bias voltage on the collector is almost equal to the positive supply voltage, therefore any positive going signal will cause the output voltage at the output bond pad to exceed the DC supply voltage. When the normal output voltage swing exceeds one diode voltage drop, the first steering diode 30*h* conducts and limits the output voltage, undesirably distorting the radio frequency signal.

While such techniques have offered some ESD protection, further improvement is considered necessary. The need for a new ESD protection technique for circuits coupled to an output stage is desirable.

SUMMARY OF THE INVENTION

In accordance with the present invention, an integrated circuit includes a circuit coupled between an output bond pad and a ground bond pad. The circuit includes a transistor having a first electrode coupled to the output bond pad and a second electrode coupled to the ground bond pad. A degeneration device is coupled between the second electrode and the ground bond pad. At least one diode is coupled between the second electrode and the ground bond pad with the anode of the at least one diode coupled to the second electrode and the cathode of the at least one diode coupled to the ground bond pad.

DETAILED DESCRIPTION

Figure 1:
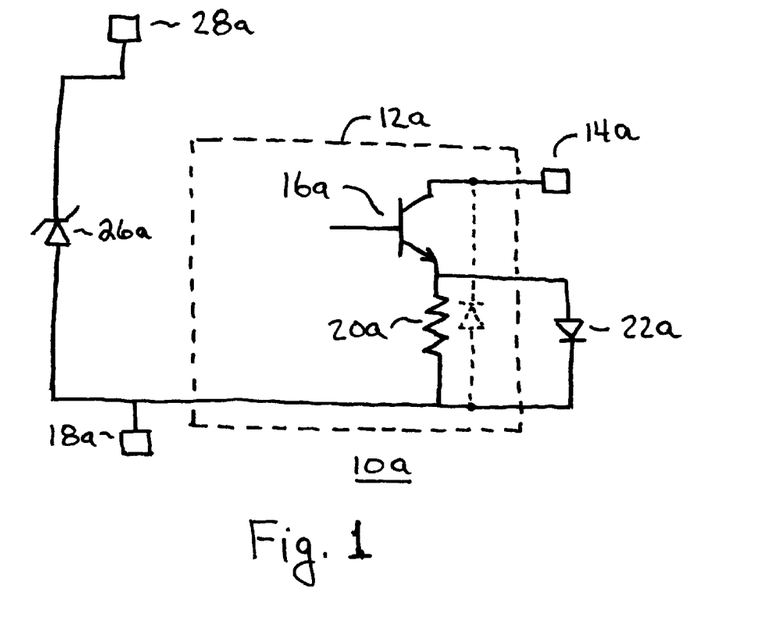
FIG. 1 is a schematic diagram of a portion of an integrated circuit incorporating electrostatic discharge protection of an output stage of a circuit, comprising a bipolar transistor and a degeneration device, in accordance with the present invention.

FIG. 1 illustrates a portion of an integrated circuit 10*a* having elements to provide electrostatic discharge protection to circuit 12*a*, comprising an output stage, coupled to output bond pad 14*a*. While only one output stage is illustrated, it is understood that there may be more than one output stage. Circuit 12*a*, which is a portion of integrated circuit 10*a*, may be but is not limited to being an amplifier operable at radio frequencies, such as frequencies greater than 500 megahertz. The output stage of circuit 12*a* includes an NPN transistor 16*a* in a common-emitter configuration, although the invention is not limited thereto. The collector of transistor 16*a* is coupled to output bond pad 14*a* and the emitter of transistor 16*a* is coupled to AC ground bond pad 18*a*. There may be other circuit components (not shown) coupled to the base of transistor 16*a*. Between the emitter and the ground bond pad 18*a* there is a degeneration device 20*a* such as but not limited to a resistor or inductor. The degeneration device 20a linearizes operation of circuit 12a under normal operating conditions. The voltage drop across the degeneration device 20a is small during normal operation, typically less than one diode voltage drop. However, during an ESD event, the voltage developed across the degeneration device can be quite large and potentially cause damage to both transistor 16a and degeneration device 20a.

Diode 22a is coupled across degeneration device 20a with its anode coupled to the emitter of transistor 16a and its cathode coupled to ground bond pad 18a. Diode 22a is forward-biased under normal operating conditions of circuit 12a. Since the emitter of transistor 16a under normal operating conditions of circuit 12a is not more than one diode voltage drop above the potential of ground bond pad 18a, diode 22a does not conduct during normal operating conditions of circuit 12a. Diode 22a protects circuit 12a, the output stage of the amplifier, including degeneration devices therein, from excessive voltage/current during an ESD event.

A diode manufactured as small as possible in a given processing/line width technology has a smaller cathode-to-anode capacitance than a larger diode manufactured in the same processing/line width technology. Diode 22a is sized to accommodate the anticipated ESD current to protect regeneration device 20a. The capacitive reactance of diode 22a translates back to the base of transistor 16a as a negative resistance. A smaller capacitance provides less of a capacitive load to be charged by an output signal developed across the degeneration device. However, a small diode has a larger impedance and therefore provides less protection during an ESD event. Thus, a tradeoff is made between the ESD protection provided and the magnitude of the parasitic capacitance introduced by diode 22a.

A positive ESD event raises the voltage of output bond pad 14a. When a positive ESD event occurs such that the voltage at the emitter of transistor 16a attempts to exceed one diode voltage drop above the potential of ground bond pad 18a, diode 22a is sufficiently forward-biased to conduct. Diode 22a conducting prevents the voltage at the emitter of transistor 16a from exceeding about one diode voltage drop above the potential at ground bond pad 18a. By switching to the conducting state, diode 22a minimizes the voltage developed at the emitter-degeneration device junction of transistor 16a, thereby protecting the base-emitter junction of transistor 16a, degeneration device(s) 20a and hence the output stage of circuit 12a from an ESD event. Diode 22a is sized to accommodate the current of any expected ESD event. Transistor 16a and diode 22a are sized to carry the anticipated ESD current without damage to the devices themselves or to circuit 12a and degeneration device 20a.

A negative ESD event reverse biases the voltage of output bond pad 14a such that the voltage at output bond pad 14a becomes more negative than the voltage of ground bond pad 18a. When a negative ESD event occurs, current flows in the inherent diode ID in transistor 16a, shown in phantom in FIG. 1. Current flows between the collector of transistor 16a and the substrate in which the transistor is formed preventing reverse bias of the base-emitter junction of transistor 16a from increasing and eventually exceeding the power dissipation the base-emitter junction can withstand without damage. One skilled in the art would know there is either a metallic connection (as shown) or back-to-back diodes(not shown) between the substrate and the ground bond pad.

A common emitter configuration of the invention illustrated in the circuit of FIG. 1 couples the radio frequency input signal to the base of transistor 16a. A common base configuration of the invention illustrated in the circuit of FIG. 1 couples the radio frequency input signal to the emitter of transistor 16a. The output signal in both configurations of the invention would appear at the collector of transistor 16a.

Figure 2:
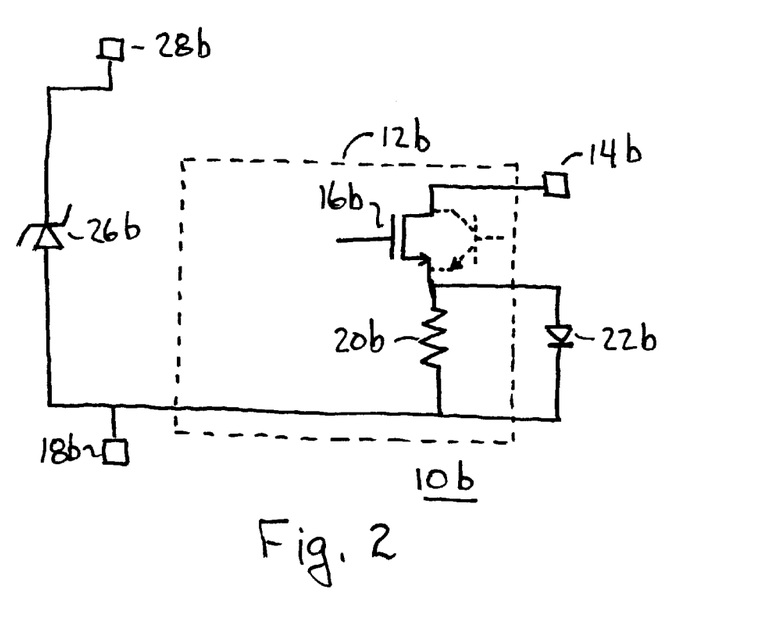
FIG. 2 is a schematic diagram of a portion of an integrated circuit incorporating electrostatic discharge protection of an output stage of a circuit, the output stage comprising a metal oxide semiconductor transistor and a degeneration device.

The transistor being protected is not limited to being a bipolar transistor. The transistor may, for example, be a metal oxide semiconductor (MOS) transistor. FIG. 2 illustrates an output stage circuit 12b including a metal oxide semiconductor transistor 16b. In circuit 12b of integrated circuit 10b, the gate of transistor 16b is coupled to other components, not shown. The drain of transistor 16a is coupled to output bond pad 14b and the source is coupled to ground bond pad 18b. The breakdown of the gate-to-source capacitance of transistor 16b must be designed to be greater than one diode voltage drop. Transistor 16b includes an inherent lateral NPN transistor 17b, shown in phantom in FIG. 2. During a positive ESD event, transistor 7b carries the expected current thereby contributing to protection of transistor 16b from oxide breakdown. Diode 22b limits the voltage developed across degeneration device 20b during an ESD event, thereby preventing damage to circuit 12b. In an ESD event, the voltage on output bond pad 14b does not exceed one voltage drop above ground pad 18b due to the presence of diode 22b, thereby protecting MOS transistor 16b and preventing the gate-source capacitance from breaking down.

Transistor 16a during a positive ESD event conducts from collector to emitter. The transistor operates in breakdown mode which will not damage the transistor if the transistor is sized large enough. If power dissipation due to the ESD event is excessive, the transistor will be damaged. With transistor 16a operating in breakdown mode, the base-emitter junction voltage may become reverse biased and damage the base-emitter junction. It has been empirically determined that a 70×10E-6 meter by 70×10E-6 meter by 0.15×10E-6 meter transistor 16a is able to withstand the power dissipation from an ESD event without damage. A transistor of this size is not necessarily the smallest transistor that could withstand power dissipation from an ESD event without damage.

There is an inherent diode, normally reverse biased, between the drain of transistor 16b and the substrate in which transistor 16b is formed. The substrate is tied to ground pad 18b as mentioned above. During a negative ESD event, current flows between ground pad 18b and output bond pad 14b, thereby protecting transistor 6b and circuitry 12b of integrated circuit 10b.

Figure 3:
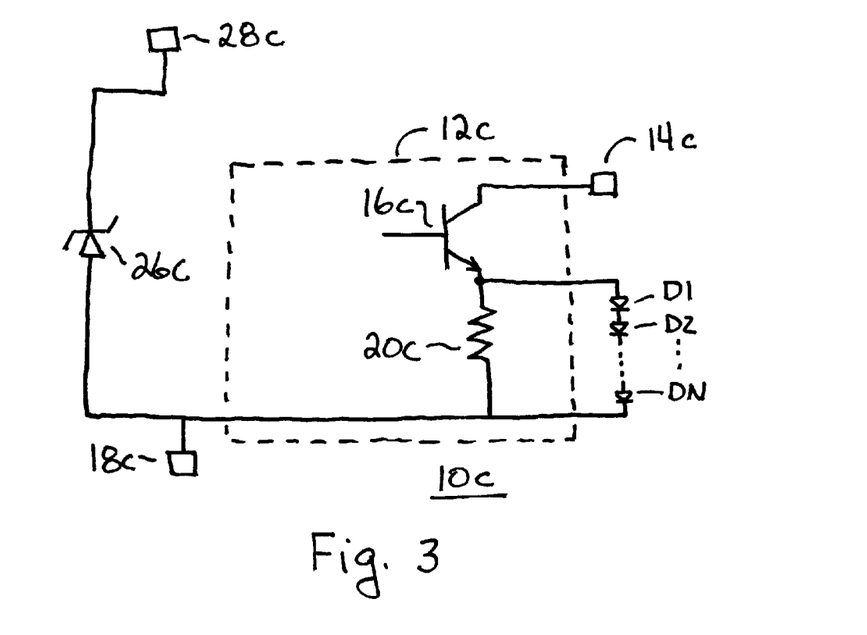
FIG. 3 is a schematic diagram of a portion of an integrated circuit incorporating an alternate embodiment electrostatic discharge protection circuit comprising a plurality of at least two series coupled diodes.

FIG. 3 illustrates an alternate embodiment integrated circuit 10c in which diode 22a of the FIG. 1 embodiment is replaced with two or more series coupled diodes D1, D2, . . . , DN coupled in series across degeneration device 20c. Providing two or more series coupled diodes between the emitter of transistor 16b and ground bond pad 18b reduces the capacitive load on output bond pad 14c, and thus the capacitive load on the emitter of transistor 16b.

Each of diodes D1, D2, . . . , DN, is sized to handle currents in the range expected during an ESD event, such as one to two amperes. Since diodes D1, D2, . . . , DN, are coupled in series, the total capacitance on the emitter of transistor 16c due to the presence of the diodes is less when compared to the capacitance of a single diode since the total inverse capacitance is the sum of the inverse of each of the individual capacitances. When the diodes are identical, and there are two diodes, the capacitance is reduced to one-half of the capacitance of a single one of the diodes. Reducing the capacitance on the emitter of transistor 16c reduces the loss of signal provided by circuit 12c that is developed across regeneration device 20c.

Furthermore, since the voltage developed across degeneration device 20c is less than (N−1) diode voltage drops, where N is the number of diodes, under normal operation of circuit 12c, the diodes D1, D2, . . . , DN, although forward biased, are not sufficiently forward biased to be conductive. Concomitantly, the voltage at the emitter of transistor 16b must rise to a voltage level corresponding to the number of diode voltage drops represented by the series coupled diodes to switch the forward-biased series coupled diodes to be conductive. Under conditions of an ESD event where output bond pad 14c is at a higher potential than ground bond pad 18c, diodes D1, D2, . . . , DN would be sufficiently forward biased to be conductive, thereby providing a path to ground for current produced by an ESD event and in turn the diodes protect transistor 16c and circuit 12c from damage.

The maximum number of diodes across degeneration device 20b that may be used to provide ESD protection is limited by the breakdown voltage of the emitter-base junction of transistor 16b. The breakdown of the emitter-base junction of transistor 16b is undesirable. The number of series coupled diodes is selected such that the voltage at the emitter-base junction rising causes the diodes to become conductive at a voltage level before the voltage is reached that would cause breakdown of the emitter-base junction of transistor 16b. More than a few diodes result in lessened ESD protection. Preferably, no more than three diodes are employed. One skilled in the art could design a metal oxide semiconductor circuit 12c using multiple series coupled diodes D1, D2, . . . , DN.

Figure 4:
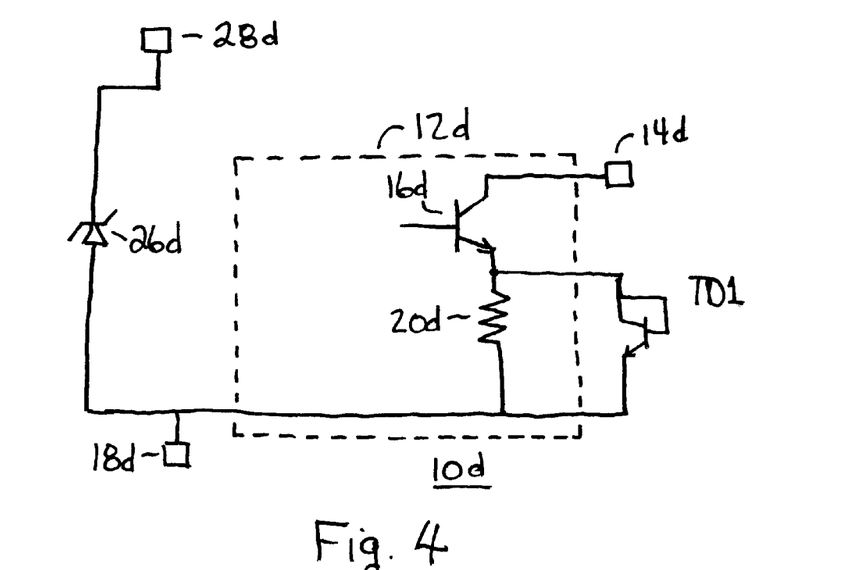
FIG. 4 is a schematic diagram of a portion of an integrated circuit, similar to FIG. 1, in which a bipolar transistor is configured as a diode.

FIG. 4 illustrates an alternate embodiment integrated circuit 10d in which a transistor is configured as a diode TD1 across degeneration device 20d. The transistor configured as a diode in FIG. 4 is illustrated as a bipolar transistor but the invention is not limited thereto.

Figure 5:
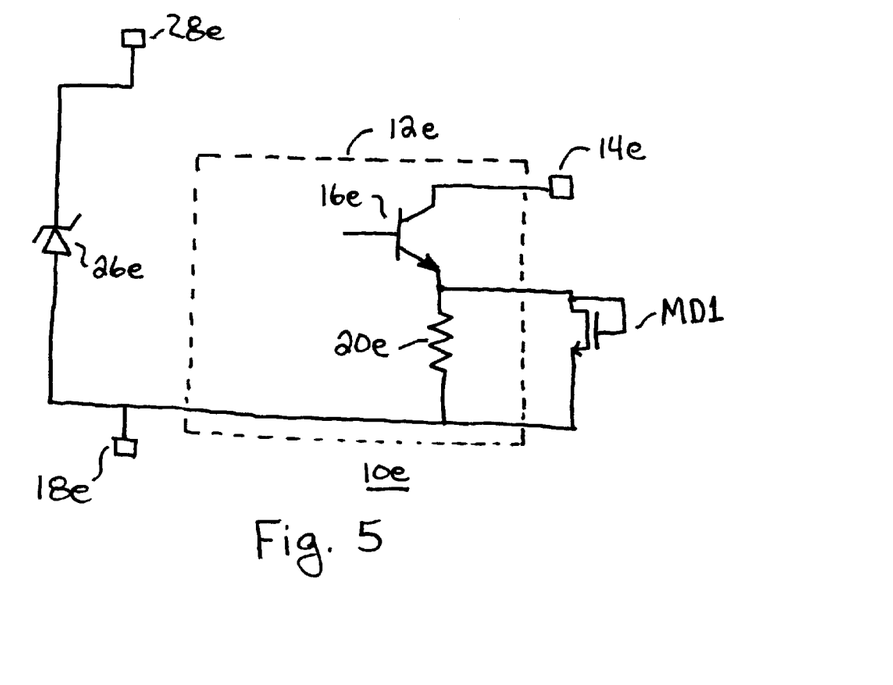
FIG. 5 is a schematic diagram of a portion of an integrated circuit, similar to FIG. 4, in which a metal oxide semiconductor transistor is configured as a diode.

FIG. 5 illustrates an alternate embodiment integrated circuit 10e in which a metal oxide semiconductor transistor is configured as a diode MD1 across degeneration device 20e.

Figure 6:
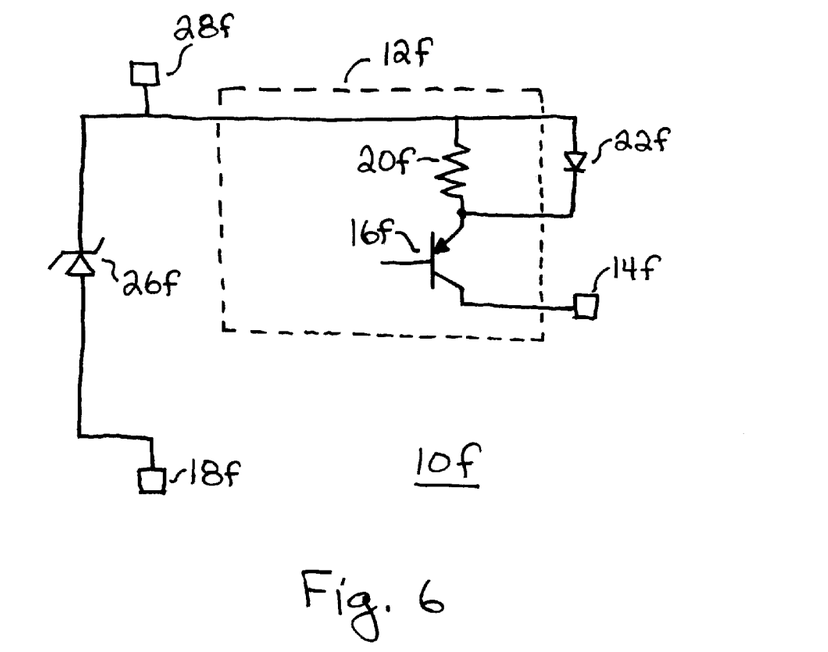
FIG. 6 is a schematic diagram of a portion of an integrated circuit incorporating electrostatic discharge protection of an output stage of a circuit comprising a PNP transistor.

FIG. 6 illustrates an alternate embodiment integrated circuit 10f in which a PNP transistor 16f is employed in circuit 12f of the amplifier output stage. Transistor 16f is configured in a common emitter configuration. One skilled in the art would recognize the need to reverse polarity of the power supply, as well as the location of regeneration device 20f and the location and polarity of diode 22f.

Figure 7:
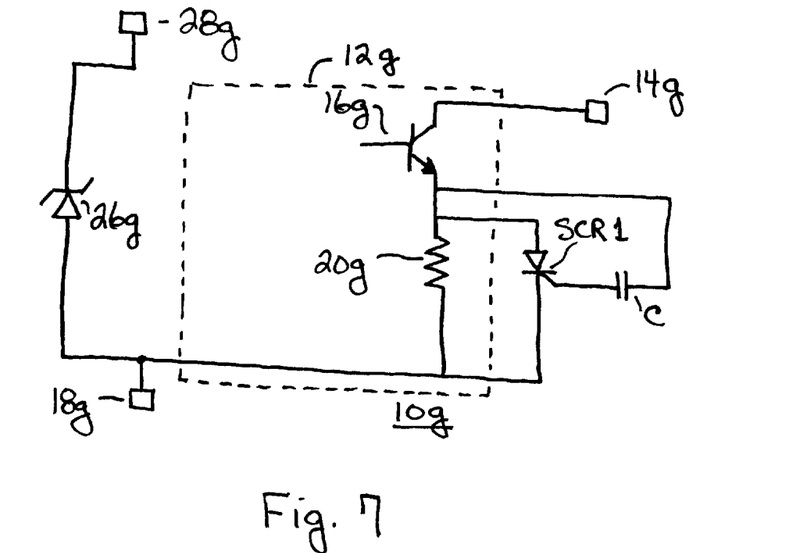
FIG. 7 is a schematic diagram of a portion of an integrated circuit incorporating electrostatic discharge protection of an output stage of a circuit comprising a four layer transistor.

FIG. 7 illustrates an alternate embodiment integrated circuit 10g in which a four-layer transistor, such as a silicon-controlled rectifier or triac, provides electrostatic discharge protection. The four layer transistor provides an alternative path to ground for current due to an ESD event. A silicon-controlled rectifier may be triggered by the voltage at the emitter of transistor 16g. A silicon-controlled rectifier for such application should have a holding current that is greater than the emitter bias current of transistor 16g under normal operating conditions.

FIG. 8 is a schematic diagram of a portion of an integrated circuit 10h illustrating prior art electrostatic discharge protection of an output stage.

As is known in the art, the integrated circuits 10a through 10h are typically enclosed in a package. The integrated circuit is positioned on the paddle of a lead frame having a paddle and isolated leads. Wires are bonded between corresponding bond pads on the integrated circuit and leads of the lead frame. The integrated circuit chip and bond wires are enclosed in the package, such as in an overmold operation.

While reference has been made to an output bond pad and a ground bond pad, coupling to the electrical equivalent of these bond pads would suffice. Transistors illustrated in the various embodiments are shown as a particular type of transistors, although the invention is not limited thereto. Other types of transistors may be used with the invention. While the above embodiments give typical design values suitable for an illustrative embodiment implemented in a particular technology, a wide range of transistors, resistors, and diode sizes are possible depending upon the protection needs required and component values.

What is claimed is:

1. An integrated circuit, comprising:
    a circuit to be protected from an electrostatic discharge event coupled between an output bond pad and a reference potential, the circuit comprising a transistor having a first electrode coupled to the output bond pad, and a second electrode;
    a degeneration device coupled between the second electrode and the reference potential; and
    a diode coupled between the second electrode and the reference potential, an anode of the diode coupled to the second electrode and a cathode of the diode coupled to the reference potential, the diode being forward biased and non-conducting during normal operation ofthe circuit, the diode being forward biased and conducting during the electrostatic discharge event that raises a voltage at the output bond pad more than one diode voltage drop above the voltage ofthe reference potential, the integrated circuit being configured so as to eliminate a need for a steering diode connected to the output bond pad.

2. An integrated circuit as recited in claim 1, wherein the transistor comprises a bipolar transistor.

3. An integrated circuit as recited in claim 2, wherein the transistor is in a common emitter configuration.

4. An integrated circuit as recited in claim 2, wherein the transistor is an NPN transistor.

5. An integrated circuit as recited in claim 2, wherein the transistor is a PNP transistor and a polarity of the diode is reversed.

6. An integrated circuit as recited in claim 1, wherein the diode is a transistor configured as a diode.

7. An integrated circuit as recited in claim 6, wherein the diode is a bipolar transistor configured as a diode.

8. An integrated circuit as recited in claim 6, wherein the diode is a metal oxide semiconductor transistor configured as a diode.

9. An integrated circuit as recited in claim 1, wherein the diode is comprised of at least two series coupled diodes, the at least two series diodes being forward biased and non-conducting during normal operation of the circuit, the at least two diodes being forward biased and conducting during an electrostatic discharge event that takes the voltage at the output bond pad to a voltage level relative to the voltage level of the ground bond pad that is greater than one diode voltage drop for each diode in the at least two series coupled diodes.

10. An integrated circuit as recited in claim 1, further comprising a zener diode between a power supply bond pad and the ground bond pad, the zener diode having a cathode coupled to the power supply bond pad and an anode coupled to the ground bond pad.

11. An integrated circuit as recited in claim 1, wherein the integrated circuit is encapsulated in a housing with leads coupled to said bond pads extending therefrom.

12. An integrated circuit, comprising:
a circuit to be protected from an electrostatic discharge event coupled between an output bond pad and a reference potential, the circuit comprising a transistor having a first electrode coupled to the output bond pad, and a second electrode;
a degeneration device coupled between the second electrode and the reference potential; and
at least two series coupled diodes coupled between the second electrode and the reference potential, an anode of one of the at least two diodes coupled to the second electrode, a cathode of one of the at least two diodes coupled to the reference potential, the at least two series coupled diodes being forward biased and non-conducting during normal operation of the circuit, the at least two diodes being forward biased and conducting during the electrostatic discharge event that raises a voltage at the output bond pad to a voltage level relative to the voltage level of the reference potential that is greater than one diode voltage drop for each diode in the at least two series coupled diodes, the integrated circuit being configured so as to eliminate a need for a steering diode connected to the output bond pad.

13. An integrated circuit as recited in claim 12, wherein the transistor comprises a bipolar transistor.

14. An integrated circuit as recited in claim 13, wherein the transistor is in a common emitter configuration.

15. An integrated circuit as recited in claim 13, wherein the transistor is an NPN transistor.

16. An integrated circuit as recited in claim 13, wherein the transistor is a PNP transistor and a polarity of the diode is reversed.

17. An integrated circuit as recited in claim 12, wherein at least one of the at least two diodes is a transistor configured as a diode.

18. An integrated circuit as recited in claim 17, wherein at least one of the at least two diodes is a bipolar transistor configured as a diode.

19. An integrated circuit as recited in claim 17, wherein at least one of the at least two diodes is a metal oxide semiconductor transistor configured as a diode.

20. An integrated circuit as recited in claim 12, further comprising a zener diode between a power supply bond pad and the reference potential, the zener diode having a cathode coupled to the power supply bond pad and an anode coupled to the ground bond pad.

21. An integrated circuit as recited in claim 12, wherein the integrated circuit is encapsulated in a housing with leads coupled to bond pads extending therefrom.

* * * * *

UNITED STATES PATENT AND TRADEMARK OFFICE
CERTIFICATE OF CORRECTION

PATENT NO.     : 6,529,059 B1
DATED          : March 4, 2003
INVENTOR(S)    : Davis It is certified that error appears in the above-identified patent and that said Letters Patent is hereby corrected as shown below:

The title page, showing the illustrative figure, should be deleted and substitute therefor the attached title page.

Please delete drawing sheets 1-4 and insert the attached drawing sheets 1-2.

Signed and Sealed this

Twelfth Day of August, 2003

JAMES E. ROGAN
*Director of the United States Patent and Trademark Office*

(12) United States Patent
Davis (10) Patent No.: US 6,529,059 B1
(45) Date of Patent: Mar. 4, 2003

(54) OUTPUT STAGE ESD PROTECTION FOR AN INTEGRATED CIRCUIT

(75) Inventor: Paul Cooper Davis, Muhlenberg Township, Berks County, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/626,221

(22) Filed: Jul. 26, 2000

(51) Int. Cl.$^7$ .............................. H03K 5/08; H03L 5/00
(52) U.S. Cl. ...................... 327/310; 361/90; 361/91.1; 327/327; 327/314
(58) Field of Search ................................. 327/310, 313, 327/314, 325, 327, 328; 361/90, 91.1, 111

(56) References Cited

U.S. PATENT DOCUMENTS

| | | | |
|---|---|---|---|
| 4,763,184 A | | 8/1988 | Krieger et al. ............ 357/23.13 |
| 4,990,802 A | | 2/1991 | Smooha ..................... 307/482 |
| 5,065,113 A | * | 11/1991 | Boezen et al. ............. 330/260 |
| 5,264,723 A | | 11/1993 | Strauss ..................... 257/532 |
| 5,304,839 A | | 4/1994 | Chen et al. ................ 257/546 |
| 5,345,357 A | | 9/1994 | Painka ...................... 361/56 |
| 5,391,948 A | * | 2/1995 | Izumita ..................... 327/310 |
| 5,446,302 A | | 8/1995 | Beigel et al. ............... 257/355 |
| 5,463,520 A | | 10/1995 | Nelson ...................... 361/56 |
| 5,465,070 A | * | 11/1995 | Koyama et al. ............ 327/350 |
| 6,154,063 A | * | 11/2000 | Fang et al. ................ 326/126 |
| 2002/0008563 A1 | * | 1/2002 | Lin .......................... 327/310 |

OTHER PUBLICATIONS

"Input–protection scheme tops other approaches", Mediatronix Private Limited, Kerala, India, Kannan Natarajan, EDN Jan. 6, 2000. P. 124.

"Input–Protection Scheme Tops Other Approaches," K. Natarajan, Mediatronix Private Limited, Kerala, India, *Design Ideas, EDN*, Jan. 6, 2000.

"ESD In Silicon Integrated Circuits," Ajith Amerasekera et al., *Design And Measurement in Electronic Engineering*, 1995.

* cited by examiner

Primary Examiner—Terry D. Cunningham
Assistant Examiner—Quan Tra
(74) Attorney, Agent, or Firm—Ryan, Mason & Lewis, LLP (57) ABSTRACT

An integrated circuit including a transistor having a first electrode coupled to an output bond pad and a second electrode coupled to a reference potential, such as ground bond pad. A degeneration device is coupled between the second electrode and the reference potential. A diode is coupled between the second electrode of the transistor and the reference potential with the anode of the diode coupled to the second electrode reference potential and the cathode of the diode coupled to the reference potential for an NPN transistor.

21 Claims, 4 Drawing Sheets